United States Patent [19]
Clampitt

[11] Patent Number: 5,994,232
[45] Date of Patent: Nov. 30, 1999

[54] ETCHING METHOD FOR USE IN FABRICATION SEMICONDUCTOR DEVICE

[75] Inventor: Darwin A. Clampitt, Boise, Id.

[73] Assignee: Micron Technology, Inc., Boise, Id.

[21] Appl. No.: 09/137,522

[22] Filed: Aug. 20, 1998

Related U.S. Application Data

[63] Continuation of application No. 08/708,694, Sep. 5, 1996, Pat. No. 5,798,303.

[51] Int. Cl.$^6$ ...................... H01L 21/302; H01L 21/3065
[52] U.S. Cl. .......................... 438/706; 438/719; 438/720; 438/725
[58] Field of Search .................................. 438/720, 725, 438/906, 706, 719

[56] References Cited

U.S. PATENT DOCUMENTS

| | | |
|---|---|---|
| 4,343,677 | 8/1982 | Kinsborn et al. . |
| 4,460,435 | 7/1984 | Maa . |
| 4,495,220 | 1/1985 | Wolf et al. . |
| 4,501,061 | 2/1985 | Wonnacott . |
| 4,698,128 | 10/1987 | Berglund et al. . |
| 5,007,982 | 4/1991 | Tsou ........................................ 438/585 |
| 5,007,983 | 4/1991 | Lerner et al. . |
| 5,017,513 | 5/1991 | Takeuchi . |
| 5,147,499 | 9/1992 | Szwejkowski et al. ................. 438/704 |
| 5,356,833 | 10/1994 | Maniar et al. . |
| 5,368,686 | 11/1994 | Tatsumi et al. . |
| 5,378,648 | 1/1995 | Lin et al. ................................. 438/719 |
| 5,382,316 | 1/1995 | Hills et al. ................................. 216/67 |
| 5,474,615 | 12/1995 | Ishida et al. . |
| 5,510,158 | 4/1996 | Hiramoto et al. ....................... 427/582 |
| 5,599,743 | 2/1997 | Nakagawa et al. . |
| 5,660,681 | 8/1997 | Fukuda et al. . |
| 5,798,303 | 8/1998 | Clampttt ................................. 438/720 |

Primary Examiner—William Powell
Assistant Examiner—Lynette T. Umez-Eronini
Attorney, Agent, or Firm—Mueting, Raasch & Gebhardt, P.A.

[57] ABSTRACT

An etching method includes providing a first surface and a second surface with the second surface lying substantially vertical to the first surface. A material is provided over at least a portion of the first and second surface. The material is anisotropically etched from at least the first surface resulting in a blocking material formed over at least a portion of the material on the second surface. The blocking material is removed and the portion of the material formed over the second surface is isotropically etched. The blocking material may be a polymer material, and the removing step may include oxidizing the polymer material.

23 Claims, 3 Drawing Sheets

ETCHING METHOD FOR USE IN FABRICATION SEMICONDUCTOR DEVICE

This is a continuation of application Ser. No. 08/708,694, filed Sep. 5, 1996, now U.S. Pat. No. 5,798,303 which is incorporated herein by reference.

FIELD OF THE INVENTION

The present invention relates to the fabrication of semiconductor devices. In particular, the present invention relates to methods of etching in the fabrication of semiconductor devices.

BACKGROUND OF THE INVENTION

Various etching processes are utilized in the fabrication of semiconductor devices. Such etching processes are utilized to control and maintain critical dimensions of various device structures, such as, for example, transistors, capacitors, and interconnects. As semiconductor devices become more integrated and miniaturized, the maintenance and control of such critical dimensions of device structures become more important.

At least one goal of an etch process in the fabrication of devices is to be able to reproduce the features of a mask used in the etching process together with control of the etched features. For example, etches are typically highly selective to the film or layer under the material being etched. Further, for example, dry etching can provide more control of the etched features, relative to wet etching, as dry etching can be performed in an anisotropic and/or isotropic manner as opposed to isotropic wet etching.

One or more anisotropic and isotropic etching steps can be performed to control the etching of different device features. However, when etching device features, such as, for example, the etching of conductive material on vertical or near vertical (e.g., substantially vertical) sidewalls of a device structure, problems may occur from the use of anisotropic etching steps. For example, an anisotropic etch, may be used to remove a bulk of conductive material formed over a device structure having substantially vertical sidewalls as one step in patterning the conductive material. Such an anisotropic etch of the conductive material leaves a blocking material over the vertical or near vertical sidewalls which are to be etched, such as, a carbon based polymer material formed at least in part from etching of the photoresist used for such patterning. The blocking material inhibits the later use of an isotropic etch to remove the conductive material under the blocking material from the substantially vertical sidewalls. As a result of the inhibition of the isotropic etch to remove conductive material from the substantially vertical sidewalls,. undesired conductive material, i.e. stringers, are left behind at the sidewalls.

Therefore, there is a need in the art for etching methods that allow for adequate removal of material, such as, for example, conductive material, from the substantially vertical sidewalls of a device structure during fabrication of semiconductor devices. The present invention provides such a method overcoming the problems as described above and others that will be readily apparent to one skilled in the art from the description of the present invention below.

SUMMARY OF THE INVENTION

An etching method of the present invention for use in the fabrication of semiconductor devices includes providing a first surface and a second surface with the second surface lying substantially vertical to the first surface. A material is provided over at least a portion of the first and second surfaces. The material is anisotropically etched from at least a portion of the first surface resulting in a blocking material formed over at least a portion of the material on the second surface. The blocking material is removed and the portion of the material on the second surface is isotropically etched.

In one embodiment of the method, the blocking material is a polymer material and the removing step includes the step of oxidizing the polymer material. In other embodiments with respect to the oxidizing step, the oxidation may include the utilization of ozone and an activation agent or the utilization of a plasma including oxygen.

Further, in another embodiment of the method, the layer of material is a conductive material, such as polysilicon. In other embodiments, where the material is a conductive material, the anisotropic etch and isotropic etches may be performed using at least one of a plasma including a chlorine containing gas, a plasma including a fluorine containing gas, and oxygen.

In yet other embodiments of the method, the removal of the blocking material is performed in a clean chamber and/or the removing step and isotropic etching step may be performed in the same plasma etch, such as with a plasma including a fluorine containing gas and oxygen.

An etching method in accordance with the present invention for use in etching a conductive material formed on a device structure is also described. The device structure includes a first surface and a second surface substantially vertical relative to the first surface. The conductive material is anisotropically etched from at least a portion of the first and second surface resulting in a polymer material formed over a residual portion of the conductive material on the second surface. The polymer material is selectively etched and the residual portion is isotropically etched.

In one embodiment of the invention, the polymer material etching step includes the step of oxidizing the polymer material. Further, the removal of the selective etching of the polymer material may be performed in a clean chamber.

A method of etching in accordance with the present invention for use in the fabrication of a memory device is also described. The structure of the memory device includes a generally horizontal surface and a sidewall of insulating material substantially vertical to the horizontal surface. A conductive material is provided over the horizontal surface and the sidewall. The conductive material is anisotropically etched from at least a portion of the horizontal surface resulting in a polymer material formed over at least a portion of conductive material on the sidewall. The polymer material is selectively etched from the sidewall and the at least the portion of conductive material on the sidewall is isotropically etched.

In one embodiment of the method, the polymer material etching step includes the step of oxidizing the polymer material. The oxidation step may include the utilization of ozone and an activation agent or may include the use of a plasma including oxygen.

In further embodiments of the method, the conductive material is polysilicon, the selective etching of the polymer material is performed in a clean chamber, and/or the etching of the polymer material and the isotropic etching step are performed using the same plasma etch.

In another etching method in accordance with the present invention for use in etching a conductive material provided on a device structure, the device structure includes a first surface and a second surface substantially vertical relative to the first surface. Conductive material is anisotropically etched from the first and second surface resulting in a polymer material formed over a residual portion of the conductive material on the second surface. An oxygen plasma descum is performed to remove the polymer material and the residual portion is isotropically etched.

In other embodiments of this method, the oxygen plasma descum step includes the use of a plasma including oxygen and an inert carrier. Further, the oxygen plasma descum step may be performed in a clean chamber and/or the oxygen plasma descum step and the isotropic etching step may be performed using the same plasma etch.

Another etching method for use in etching a conductive material formed on a device structure is described. The device structure includes a first surface and a second surface substantially vertical relative to the first surface. The method includes anisotropically etching conductive material from the first and second surface resulting in a polymer material formed over a residual portion of the conductive material on the second surface. The polymer material is removed using ozone and an activation agent and the residual portion is isotropically etched. In other embodiments of the method, the activation agent includes heat and/or ultraviolet light.

BRIEF DESCRIPTION OF THE DRAWINGS

FIG. 2 shows the deposited photoresist for patterning the conductive layer provided over the device structure. FIG. 3 shows the result of the anisotropic etching step. FIG. 4 shows the result of the descum step in accordance with the present invention and FIG. 5 shows the final profile of the substantially vertical sidewall following the isotropic etching step used to remove residual conductive material on the sidewall.

DETAILED DESCRIPTION OF THE EMBODIMENTS

The etching method 10 in accordance with the present invention shall be described with reference to FIGS. 1–5 and the Example that follows. The etching method 10 is beneficial for use whenever a material, such as, for example, a conductive material, is to be etched from a vertical or near vertical (e.g. substantially vertical) sidewall of a device structure, such as, for example, a sidewall of an insulating spacer, and further, when the etch includes an anisotropic etch step that forms a blocking material on at least a portion of the sidewall inhibiting a later isotropic etch of material therefrom. The present invention maintains the critical dimension of the device structure yet allows the conductive material to be etched and patterned in a timely manner.

Figure 1:
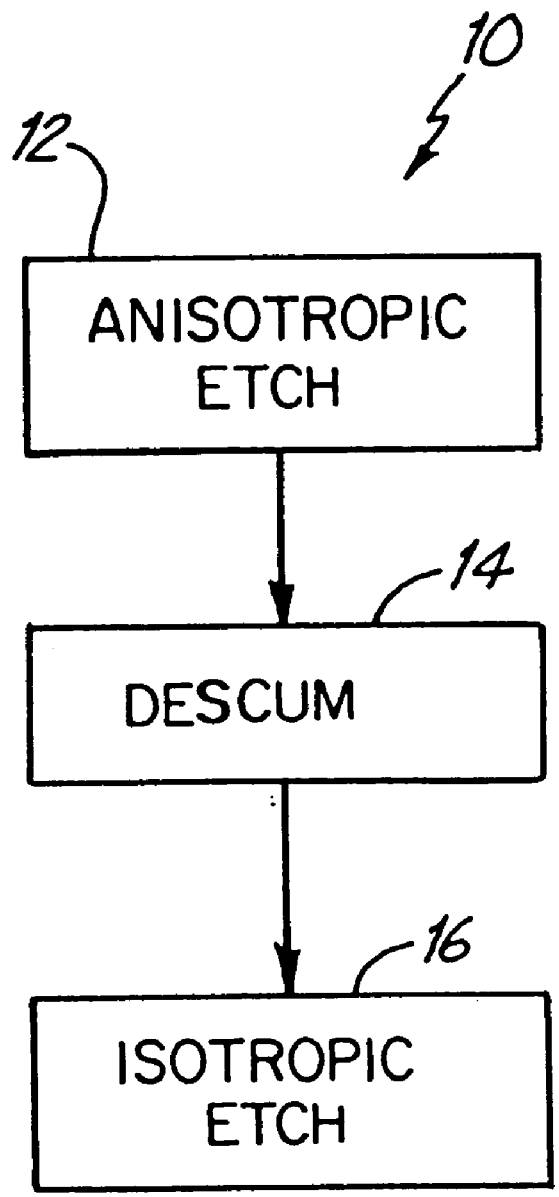
FIG. 1 is a general flow diagram of the etching method in accordance with the present invention.

As shown in FIG. 1, the etching method 10 includes performing an anisotropic etch step 12 to remove a bulk of the material to be etched from the device structure as patterned using a mask, i.e. photoresist. The anisotropic etch step 12 results in a blocking material, such as, for example, a polymer material, formed over a residual portion of the material on the substantially vertical wall that is not removed by the anisotropic etch step 12. The etching method 10 then utilizes a descum step 14, such as, for example, an oxygen plasma descum, to selectively etch the blocking material from the substantially vertical sidewall of the device structure.

After the blocking material is removed from the substantially vertical sidewall, an isotropic etching step 16 is utilized to remove the residual portion of the material on the sidewall. By removing the blocking material from the substantially vertical sidewall prior to performing the isotropic etch step 16, the blocking material is prevented from inhibiting the isotropic etching step 16 from removing the material thereunder. In other words, the blocking material is prevented from inhibiting the isotropic etch step 16 to produce a stringer free sidewall.

Therefore, in accordance with the present invention, the etching method 10 utilized during the fabrication process allows for control of the etching process such that critical dimensions of device structures are maintained. The etching method of the present method is beneficial for use in any fabrication process where a blocking material needs to be selectively removed between the performance of an anisotropic etch step and an isotropic etch step when the isotropic etch step is used to remove material from the substantially vertical sidewalls of a device structure left after the anisotropic etch has been performed. The etching method 10 can be integrated into well established process flows, such as the process flow described in the illustration below.

The illustration given below describes a process flow which benefits from the use of the etching method 10 in accordance with the present invention. However, there are various other process flows during which material is etched from a substantially vertical sidewall which may benefit from the use of the present invention. For example, the etching method 10 may be beneficial for use in etching various contact holes, etching silicon dioxide or silicon nitride spacers for achieving controlled dimensions, or any other material at a substantially vertical wall that has blocking material formed thereon during an anisotropic etch. The present invention as described herein is not limited to only the process flow as illustrated herein, but is limited only as described in the accompanying claims.

The illustrative process flow utilizing the etching method 10 in accordance with the present invention shall be described with reference to FIGS. 2–5. FIGS. 2–5 illustrate the etching method steps utilized for etching a conductive material from a substantially vertical sidewall during the patterning of an electrode for a stacked capacitor above wordlines in a memory cell. An object of the etch is to produce a stringer free sidewall after the etch is completed.

Figure 2:
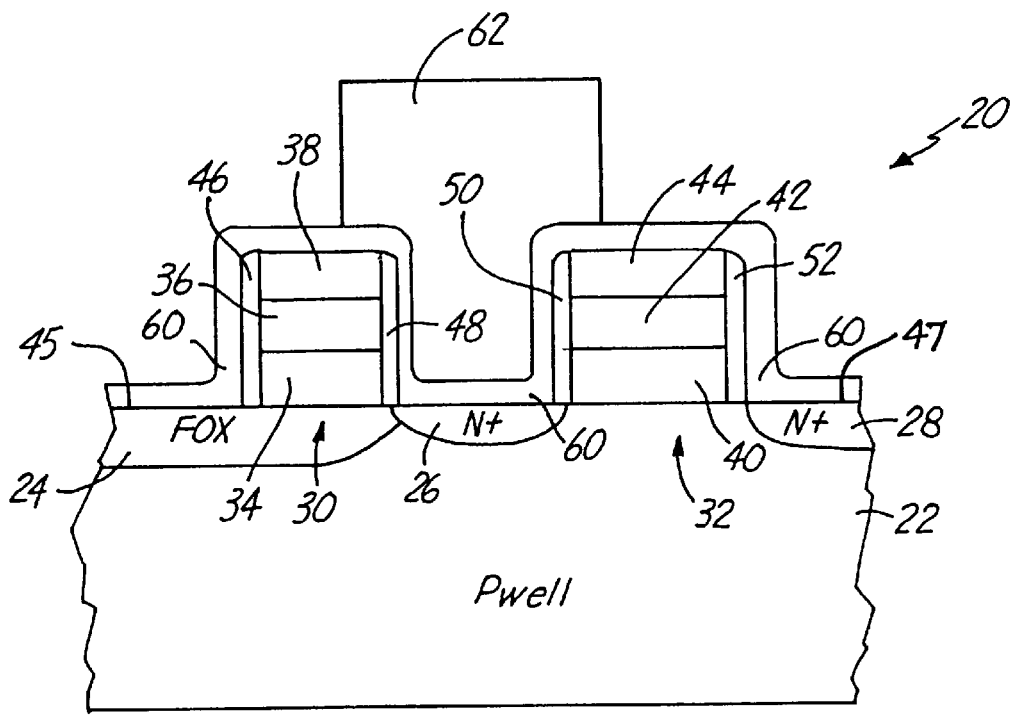
FIGS. 2–5 are illustrations of the steps of the etching method used to etch a substantially vertical sidewall of a device structure in accordance with the present invention.

As shown in FIG. 2, the device structure 20, i.e., part of a memory cell, includes substrate 22 having field oxide region 24, active regions 26 and 28, and wordlines 30 and 32 formed with respect thereto. Wordline 30 may include, for example, a polysilicon region 34, a metal silicide region 36 (such as, for example, tungsten silicide), and an insulating region 38 (such as an oxide, for example, TEOS). Likewise, wordline 32 includes polysilicon region 40, a metal silicide region 42, and an insulating region 44.

Further, the wordline 30 includes insulating spacers 46 and 48 having substantially vertical sidewalls relative to substantially horizontal surface 45 and wordline 32 includes insulating spacers 50 and 52 having substantially vertical sidewalls relative to substantially horizontal surface 47 of the substrate 22. For example, the insulating spacers may be formed of silicon nitride, silicon dioxide, TEOS, or any other oxide or insulating material known to be used for such spacing purposes by one skilled in the art.

A conductive layer 60 is then deposited over the device structure, including the field oxide regions, active regions, and the substantially vertical sidewalls of the spacers of the device structure 20. The illustration with respect to FIGS. 2–5 is described with use of a polysilicon conductive layer 60 to be patterned to form an electrode of a stacked capacitor for a memory cell. However, other fabrication processes may utilize other conductive materials, such as aluminum, titanium nitride, platinum, or any other conductive material typically used in the fabrication of semiconductor devices as known to one skilled in the art and the present invention is not limited only to those listed herein but rather in accordance with the accompanying claims. The method of forming the conductive layer 60 may be any conventional method known to those skilled in the art for forming the desired conductive layer 60.

Further, the present invention is not limited to anisotropic etching of a conductive layer, but rather is applicable to any anisotropic etch of any material which results in the formation of a blocking material, such as, for example, a polymer, on a substantially vertical wall that is to be etched. For example, the material may be an oxide or a nitride to be etched; wherein the anisotropic etch forms a polymer blocking material on a vertical sidewall where the material is to be etched by a later isotropic etch.

After the polysilicon conductive layer 60 is formed, the conductive layer 60 is patterned using photoresist 62. The etching method 10 in accordance with the present invention is then performed.

Figure 3:
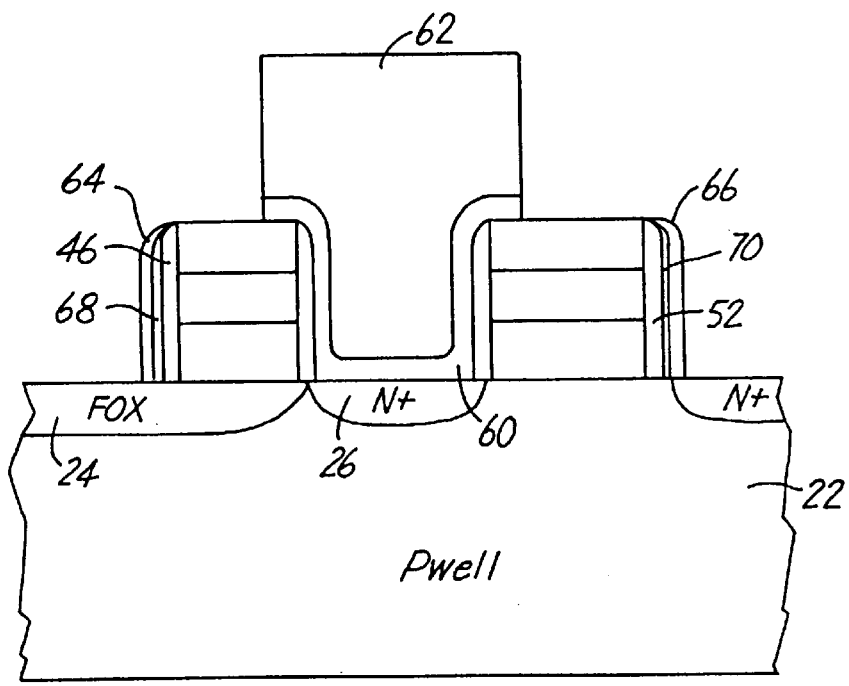

First, the polysilicon conductive material 60 is anisotropically etched. The result of the anisotropic etch is shown in FIG. 3. The anisotropic etch removes the bulk of the conductive material 60 to be removed. However, the anisotropic etch results in a polymer blocking material 64 and 66 (i.e., a carbon containing polymer) formed on the substantially vertical sidewalls of spacers 46 and 52, respectively. For example, the polymer blocking material may result in part from the etching of the photoresist as the anisotropic etch is being performed, or, for example, from the carbon or hydrogen content of the plasma used to perform the plasma anisotropic etch. Under the polymer blocking material 64 and 66, formed on the substantially vertical sidewalls of spacers 46 and 52, is residual polysilicon material, i.e., polysilicon stringers, 68 and 70, respectively, which did not get removed during the anisotropic etch.

The anisotropic etch may be performed with any plasma typically utilized for anisotropically etching conductive material. For example, the plasma may include chlorine or any chlorine containing gas or mixture, such as, for example, $Cl_2$ and $H_2$, $BCl_3$, and $Cl_2$ and $NH_3$. The plasma used depends upon the material to be etched. For example, an oxide or nitride material may be etched using a fluorine containing gas whereas a plasma including a chlorine containing gas may be more suitable for etching a metal such aluminum. However, any plasma suitable for anisotropically etching the material 60 patterned using the photoresist 62 may be used.

Further, the anisotropic etch may include the use of one or more anisotropic etches with varied etching capabilities. For example, a first step may be used to remove a substantial portion of the polysilicon to be removed and then a more controlled and/or slower anisotropic etch may be utilized to remove a substantial portion of the remaining polysilicon. However, even under more controlled conditions, the polymer blocking material still forms on the substantially vertical sidewalls and prevents adequate removal of material thereunder.

Figure 4:
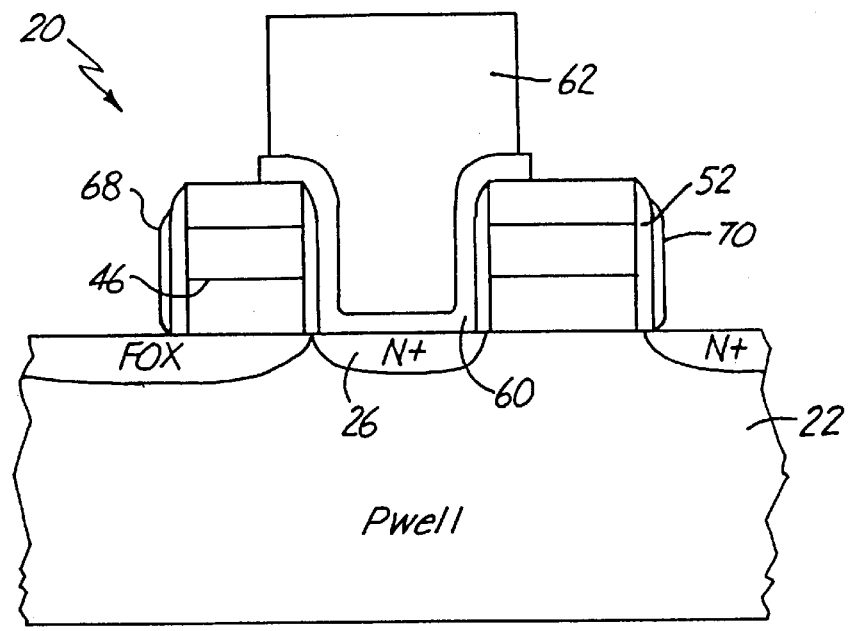

The polymer blocking material 64, 66 resulting from the anisotropic etch is then removed using a descum process resulting in the underlying residual portions 68 and 70 of the conductive material being exposed as shown in FIG. 4. The descum process includes any oxidation process for consuming the carbon of the polymer, for example, producing carbon monoxide or carbon dioxide.

The descum step may include the use of a high oxidizing agent such as ozone ($O_3$) and an activation agent for activating the ozone for oxidation of the polymer. For example, the ozone may be exposed to ultraviolet light to activate the ozone for oxidation of the polymer or any other activation agent, such as heat.

Further, any other oxidation process may be utilized for consumption of the carbon of the polymer in the descum process. For example, the descum process may include the use of an oxygen plasma to remove the polymer material formed during the anisotropic etch. The oxygen plasma may include the use of any oxygen content plasma. For example, the plasma may include He and $O_2$, or oxygen with any other inert carrier that is selective to other materials that are not to be etched.

The oxygen plasma descum step is performed for a predetermined period of time necessary to remove the polymer blocking material 64, 66. The time period is determined, at least in part, by the polymer or blocking material thickness. The thickness of the polymer, for example, is dependant on a number of factors including, but not necessarily limited thereto, the length of the time period for the anisotropic etch(s), the photoresist used, and the etching plasma utilized, i.e. the amount of carbon and hydrogen present in the system.

The pressure, power, flow rates, and time periods of the etching process may also vary to achieve the desired removal of polymer blocking material. For example, the pressure for an oxygen descum step may vary in the range of about 1 mTorr to about 10 Torr, with the lower limit controlling, at least in part, the rate of etching. The power for the plasma etch need only be sufficient to generate a stable plasma with higher powers increasing the etching rate. For example, the power may range from about 50 Watts to about 2000 Watts and the field may range from about 0 to about 200 Gauss. In addition, the flow rate for $HeO_2$ (i.e., 70% He and 30% $O_2$) in the descum step may be in the range of about 5 sccm to about 2000 sccm.

As one skilled in the art will recognize, these parameters vary depending on the process being performed and the functionality of the etch desired. For example, it may be desirable to etch the polymer blocking material relative to the polysilicon or other materials with a selectivity of 2 to 1 (polymer to polysilicon). The parameters of the descum step can be adjusted to obtain such selectivity. Further, for example, the flow rates may vary depending on various circumstances, such as speed of etch, concentration of the oxygen and helium flow, etc.

The descum process is performed in any standard etching unit known to those skilled in the art. For example, the process may be performed in barrel etchers or, for example, in an etcher such as the Applied Materials 5000 Etcher available from Applied Materials Inc. of Santa Clara, Calif. Some etchers require the stabilization of gases prior to performing the etches with the units. However, many etchers do not require such stabilization and the present invention is no manner limited to etchers where stabilization is required.

The descum process is performed in a clean chamber as the descum process may attack polymer buildup on the walls of a chamber causing the polymer to oxidize and fall off onto the device structure. In other words, a clean chamber refers to any chamber that does not have a polymer layer therein of a thickness that when oxidized may fall onto the device structure being formed. The chamber may be cleaned at any time during the process flow, such as with isopropyl alcohol or any other cleaner that will remove the polymer buildup. After the chamber is cleaned, the chamber may be sufficient for processing multiple batches of wafers, i.e., the chamber need not be cleaned for each batch of wafers processed.

Small amounts of a fluorine containing gas can be used with the oxygen plasma for removing the polymer blocking material. The trace amounts of fluorine from a source such as, for example, $CF_4$ or $C_2F_6$, can enhance the ability of the plasma to etch the polymer. Further, the oxygen based descum plasma with traces of fluorine containing gas can also be used to perform the isotropic etching step as described below as well as the descum step. However, it is preferred that the steps be separated to allow for adequate control of each of the descum and isotropic etching steps separately.

Figure 5:
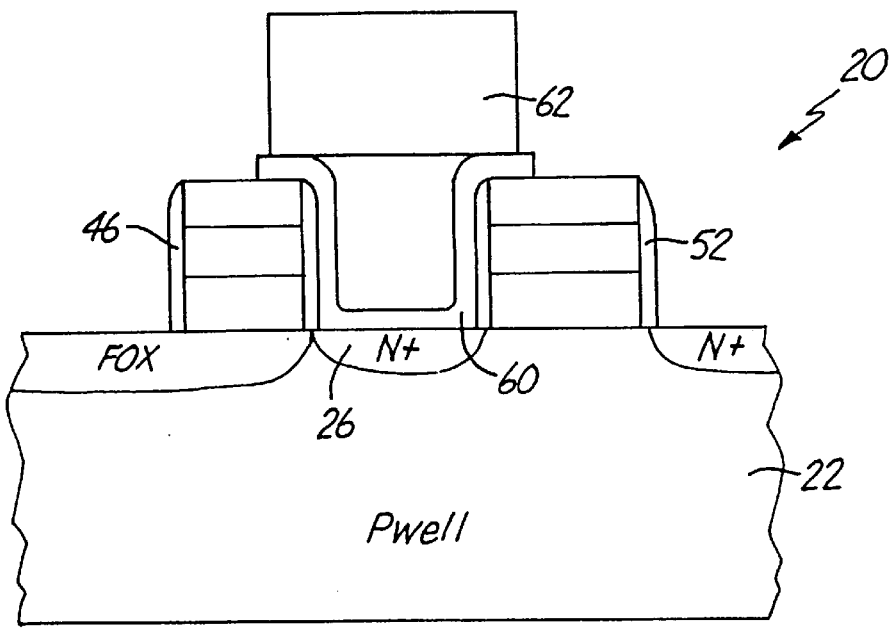

In the final step of the etching method 10, the residual portions 68 and 70 of conductive material 60 are removed from the sidewalls of the insulating spacers 46 and 52, respectively, using an isotropic etch. The resulting device structure with the patterned conductive material 60 after the residual portions 68 and 70 are removed is shown in FIG. 5. Any isotropic etch may be performed that is used to remove the polysilicon conductive material, such as, for example, a dry etch using a fluorine containing gas, alone or in combination with a chlorine containing gas and/or oxygen. Any isotropic etch suitable for etching the polysilicon from the sidewalls, i.e. lateral etch, which does not form further polymer block material on the sidewalls can be used. The present invention is not limited to any particular isotropic etching process. It should be apparent to one skilled in the art that the isotropic etch utilized will vary depending on the material to be used. For example, an oxide etch or nitride etch may utilize a plasma including a fluorine containing gas whereas an aluminum etch may utilize a plasma including a chlorine containing gas. Preferably, the etch utilized eliminates the sources of carbon and hydrogen which may lead to polymer buildup.

It should be readily apparent to one skilled in the art that the present invention is only illustrated by the description with reference to FIGS. 2–5 and that, as previously stated, other processes may also benefit from the use of a descum step between an anisotropic and isotropic etch of material from a device structure including a substantially vertical sidewall. The following is an Example describing an etch of a structure substantially similar to the one illustrated above for forming a lower electrode of a stacked capacitor of a memory cell and results from use of the etching method in accordance with the present invention.

EXAMPLE

A first control group of thirteen 6 inch wafers is etched using a standard etching procedure. A second group of twelve 6 inch wafers is etched using an etching method in accordance with the present invention including a descum step between an anisotropic etch and an isotropic etch. The etching is performed in an Applied Materials 5000 Etcher available from Applied Materials, Inc. Each of the wafers subjected to the etches are fabricated by conventional means through the deposition of the polysilicon and definition of the photoresist pattern substantially as shown in FIG. 2. The polysilicon deposited is of a nominal thickness of about 1200 Å, including textured polysilicon, and the insulating spacers are of silicon dioxide.

The standard etching method for use to etch the control group of wafers includes:

(1) Stabilizing a $Cl_2$ flow rate of 30 sccm at a pressure of 50 mTorr, 0 Watts, 75 Gauss for 5 seconds.

(2) Anisotropically etching the polysilicon for 60 seconds using a $Cl_2$ flow rate of 30 sccm at a pressure of 50 mTorr, 300 Watts, and 75 Gauss.

(3) Further anisotropically etching the polysilicon for 45 seconds using a $Cl_2$ flow rate of 30 sccm at a pressure of 50 mTorr, 150 Watts, and 75 Gauss.

(4) Stabilizing a $Cl_2$ flow rate of 15 sccm, a $SF_6$ flow rate of 20 sccm, and a $HeO_2$ (70% He and 30% $O_2$) flow rate of 5 sccm at a pressure of 300 mTorr, 0 Watts, 0 Gauss for 5 seconds.

(5) Isotropically etching the device structure using a $Cl_2$ flow rate of 15 sccm, a $SF_6$ flow rate of 20 sccm, and a $HeO_2$ (70% He and 30% $O_2$) flow rate of 5 sccm at a pressure of 300 mTorr, 150 Watts, 0 Gauss for 7 seconds.

The etching method for use to etch the second group of wafers in accordance with the present invention includes the same steps as described above with respect to the control group and further includes the following two steps between the etching step (3) and the stabilization step (4). The two steps include:

(1) Stabilizing a $HeO_2$ (70% He and 30% $O_2$) flow rate of 30 sccm at a pressure of 100 mTorr, 0 Watts, 0 Gauss for 5 seconds.

(2) Performing the descum to remove the polymer blocking material formed as a result of the anisotropic etch by selectively etching the polymer for 15 seconds using the $HeO_2$ (70% He and 30% $O_2$) flow rate of 30 sccm at a pressure of 100 mTorr, 150 Watts, and 0 Gauss.

The processing is performed in a clean chamber. The chamber is cleaned by scrubbing the chamber with isopropyl alcohol on a particle free wipe.

After the two groups of wafers are etched, the photoresist is removed using a Branson Barrel Asher followed by a piranha clean utilizing hydrogen peroxide and sulfuric acid. The wafers are then dipped for 30 seconds in a 100:1 $H_2O:HF$ solution.

After completion of the fabrication of the memory devices including the memory cells formed using the etching method described above, the wafers having 520 die, with each die including memory cells for a 4 K memory device, are subjected to a probe test procedure. In the probe test procedure, leakage is detected between adjacent electrodes formed using the etching method described above. The test procedure includes writing a one (−5.0 V) in binary code to every other memory cell of the wafer and a zero (ground) to every other adjacent memory cell. The cells are then read. The test looks for adjacent failing bits (i.e., a memory cell voltage in between ground and the binary one). If the die includes failing bits, a die failure is determined.

The average number of die failures detected by the probe test procedure of one wafer of the control group is 42.5. The average number of die failures detected by the probe test procedure of one wafer of the second group etched in accordance with the method of the present invention is 27.3. This represents a significant improvement using the method in accordance with the present invention.

Although the invention has been described with particular reference to preferred embodiments thereof, variations and modifications to the present invention can be made within a contemplated scope of the claims as is readily known to one skilled in the art.

What is claimed is:

1. A method for use in the fabrication of semiconductor devices, the method comprising:
   providing a device structure;
   forming a conductive material over the device structure;
   patterning a resist material on the conductive material resulting in first regions of the conductive material exposed for removal and second regions underlying the patterned resist material;
   removing major portions of the exposed first regions of the conductive material resulting in residual conductive material underlying a polymer blocking material;
   selectively removing the polymer blocking material relative to the device structure and remaining conductive material; and
   removing the residual conductive material.

2. The method according to claim 1, wherein removing the polymer blocking material includes oxidizing the polymer blocking material.

3. The method according to claim 2, wherein oxidizing the polymer blocking material includes using ozone and an activation agent to remove the polymer blocking material.

4. The method according to claim 2, wherein oxidizing the polymer blocking material includes using a plasma containing oxygen to remove the polymer blocking material.

5. The method according to claim 1, wherein the conductive material is polysilicon.

6. The method according to claim 1, wherein removing the major portions of the exposed first regions of conductive material and removing the residual conductive material includes etching such exposed first regions of conductive material and residual conductive material using at least a fluorine and/or chlorine plasma etchant.

7. The method according to claim 6, wherein removing the major portions of the exposed first regions of conductive material includes anisotropically etching the exposed first regions of conductive material and removing the residual conductive material includes isotropically etching the residual conductive material.

8. A method for use in the fabrication of semiconductor devices, the method comprising:
   providing a device structure, wherein the device structure includes at least an insulating material region;
   forming a conductive material over the device structure including the insulating material region;
   patterning a resist material on the conductive material resulting in first regions of the conductive material exposed for removal and second regions underlying the patterned resist material, wherein at least one portion of the exposed conductive material is located on the insulating material region;
   removing the exposed first regions of conductive material, wherein the removal of the exposed first regions of conductive material results in residual conductive material remaining on at least the insulating material region with a polymer blocking material over at least a portion of the residual conductive material;
   removing the polymer blocking material; and
   removing the residual conductive material.

9. The method according to claim 8, wherein removing the polymer blocking material includes oxidizing the polymer material.

10. The method according to claim 9, wherein oxidizing the polymer blocking material includes using ozone and an activation agent to remove the polymer blocking material.

11. The method according to claim 9, wherein oxidizing the polymer blocking material includes using a plasma containing oxygen to remove the polymer blocking material.

12. The method according to claim 8, wherein the conductive material is polysilicon and the insulating material region is formed of an oxide.

13. The method according to claim 8, wherein the insulating material region includes a sidewall of a spacer.

14. The method according to claim 8, wherein removing the exposed first regions of conductive material and removing the residual conductive material includes etching such exposed first regions of conductive material and residual conductive material using at least a fluorine and/or chlorine plasma etchant.

15. The method according to claim 14, wherein removing the exposed first regions of conductive material includes anisotropically etching the exposed first regions of conductive material and removing the residual conductive material includes isotropically etching the residual conductive material.

16. A method for forming an electrode of a capacitor structure in the fabrication of semiconductor devices, the method comprising:
   providing a device structure including at least one horizontal surface and at least one nonhorizontal surface;
   forming a conductive material over the device structure including the at least one nonhorizontal surface;
   patterning a resist material over the conductive material resulting in first regions of the conductive material exposed for removal and second regions underlying the patterned resist material, wherein at least one portion of the exposed conductive material is located on the nonhorizontal surface;
   removing the exposed first regions of conductive material, wherein the removal of the exposed first regions of conductive material results in residual conductive material remaining on at least a portion of the at least one nonhorizontal surface with a polymer blocking material over at least portion of the residual conductive material;
   removing the polymer blocking material;
   removing the residual conductive material; and
   removing the patterned resist material to form the electrode of the capacitor structure.

17. The method according to claim 16, wherein removing the polymer blocking material includes oxidizing the polymer material.

18. The method according to claim 17, wherein oxidizing the polymer blocking material includes using ozone and an activation agent to remove the polymer blocking material.

19. The method according to claim 17, wherein oxidizing the polymer blocking material includes using a plasma containing oxygen to remove the polymer blocking material.

20. The method according to claim 16, wherein the conductive material is polysilicon and the nonhorizontal surface is a surface of an oxide region.

21. The method according to claim 16, wherein the nonhorizontal surface is a sidewall of a spacer.

22. The method according to claim 16, wherein removing the exposed first regions of conductive material and removing the residual conductive material includes etching such exposed first regions of conductive material and residual conductive material using at least a fluorine and/or chlorine plasma etchant.

23. The method according to claim 22, wherein removing the exposed first regions of conductive material includes anisotropically etching the exposed first regions of conductive material and removing the residual conductive material includes isotropically etching the residual conductive material.

* * * * *